(12) United States Patent
Hewitt et al.

(10) Patent No.: US 7,372,285 B1
(45) Date of Patent: May 13, 2008

(54) SOCKET-LESS TEST BOARD AND CLAMP FOR ELECTRICAL TESTING OF INTEGRATED CIRCUITS

(75) Inventors: Larry A. Hewitt, Menlo Park, CA (US); Peyman Hojabri, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 251 days.

(21) Appl. No.: 11/137,929

(22) Filed: May 25, 2005

(51) Int. Cl.
*G01R 31/02* (2006.01)
(52) U.S. Cl. .................... 324/755; 324/760; 324/765
(58) Field of Classification Search ............... 324/760, 324/763–765; 361/704, 384; 165/80.3, 165/122
See application file for complete search history.

(56) References Cited

U.S. PATENT DOCUMENTS

| | | | | |
|---|---|---|---|---|
| 4,839,587 A * | 6/1989 | Flatley et al. | ............... | 324/761 |
| 5,086,269 A * | 2/1992 | Nobi | ............... | 324/760 |
| 5,694,049 A | 12/1997 | Singh et al. | | |
| 6,021,045 A * | 2/2000 | Johnson | ............... | 361/704 |

* cited by examiner

*Primary Examiner*—Vinh P. Nguyen
(74) *Attorney, Agent, or Firm*—Beyer Law Group LLP

(57) ABSTRACT

A socket-less test board and a clamp for clamping an integrated circuit to the socket-less test board is disclosed. The test board includes a recess region for receiving an integrated circuit to be tested. The clamp includes a base structure with a recess region to accommodate the integrated circuit and a heat sink that is positioned in contact with the package of the integrated circuit. Mounting and fastening elements mount and fasten the clamp to the test board, holding the integrated circuit in place during electrical testing.

19 Claims, 6 Drawing Sheets

SOCKET-LESS TEST BOARD AND CLAMP FOR ELECTRICAL TESTING OF INTEGRATED CIRCUITS

FIELD OF THE INVENTION

The present invention relates generally to the testing of semiconductor integrated circuits, and more particularly, to a socket-less test board and a clamp for clamping an integrated circuit to the socket-less test board.

BACKGROUND OF THE INVENTION

Semiconductor chips are typically fabricated in wafer form. A silicon wafer undergoes a series of well known processing steps to fabricate a plurality of dice on the wafer. Scribe lines separate the individual die on the wafer. After fabrication, the individual dice are singulated by cutting or sawing the wafer along the scribe lines. The individual die are then encapsulated in a package. After a new chip is designed and fabricated, it will often undergo a series of electrical tests to determine if it operates within the specifications of the device. Electrical parameters, such as clock speed or frequency, signal rise and fall times, overshoot and undershoot, bandwidth, the skew between input/output pins, etc. are all tested under various conditions to determine the specifications of the device.

The testing of the integrated circuit is typically performed on test board. A number of probe points and traces are provided on the test board. During testing, the probe points are probed by test equipment to provide test signals to the board. Traces on the board provide input signals to the integrated circuit mounted on the board. The chip processes the input signals and generates output signals. Traces on the board carry the output signals to the probe points where they are measured by the probe equipment. The probe equipment then analyses the input and output signals to ascertain the electrical parameters of the device.

A number of techniques are known for mounting the integrated circuit onto a test board. With one technique, metal pins of a socket are mounted into through-holes formed on the test board. Each of the through holes are metal plated and in electrical contact with one of the traces on the test board. The leads of the integrated circuit are inserted into receptacles in the socket. Metal traces connect the leads of the integrated circuit and the pins of the socket. Electrical paths are therefore provided between the integrated circuit and the probe points on the test board. A number of problems are associated with using a socket for mounting the integrated circuit. Since the size, dimensions, and pin lay out of most integrated circuits are different, a specific or dedicated socket must be fabricated for each device. The fabrication of a different socket for each device tends to be expensive. Sockets also do not provide ideal electrical connections between the probe points on the board and the integrated circuit, particularly devices with high lead counts. To accommodate all the leads, the through holes in the test board are typically arranged in concentric circles around the socket. Due to this arrangement, the electrical paths between the leads of the integrated circuit and the probe points are not symmetrical. As a result, the capacitance, inductance, and ohmic characteristics of the electrical paths of each trace may vary. The different electrical characteristics of each electrical path may result in inaccurate measurements of the electrical parameters being tested, such as the channel to channel slew rate, for example.

Another type of known test board calls for the soldering of the integrated circuit onto the board. After a device has been tested, the integrated circuit is removed by de-soldering and replaced with another integrated circuit. The problem with this solution is that after the soldering and removal of just a few integrated circuits, the traces on the board begin to degrade, again adversely effecting the electrical performance of the board and the ability to accurately measure and ascertain the electrical characteristics of the chip under test.

In a third type of test board arrangement, the integrated circuit is pressure mounted on the test board using a metal plunger to physically hold the chip into place. The problem with this arrangement, however, is that the pressure exerted by the plunger tends to bend or displace the leads of the integrated circuit package. There is also no "guide" to hold the chip in alignment with the contacts on the test board. Poor electrical connections can therefore result. The plunger also tends to act like a heat sink, potentially altering the measured electrical characteristics of the device under test.

A socket-less test board and a clamp for clamping an integrated circuit to the socket-less test board is therefore needed.

SUMMARY OF THE INVENTION

To achieve the foregoing, and in accordance with the purpose of the present invention, a socket-less test board and a clamp for clamping an integrated circuit to the socket-less test board is disclosed. The test board is a printed circuit board with a recess region formed within the printed circuit board. The recess is configured to receive an integrated circuit to be tested. One or more contacts are positioned adjacent the recess region on the printed circuit board. The one or more contacts are in electrical contact with one or more leads on the integrated circuit when the integrated circuit is placed within in the recess region. One or more probe points are also provided on the printed circuit board. The test board also includes one or more electrical traces, formed on the printed circuit board, to electrically couple the one or more contacts and the one or more probe points respectively. The clamp is used to clamp an integrated circuit to the test board. The clamp includes a recess formed in a base structure and generally shaped to accommodate the integrated circuit and a heat sink configured to be positioned in contact with the integrated circuit when the integrated circuit is provided in the first recess. One or mounting elements are provided to mount the base structure to the test board so that the leads of the integrated circuit are electrically coupled to the contacts on the test board.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Figure 1:
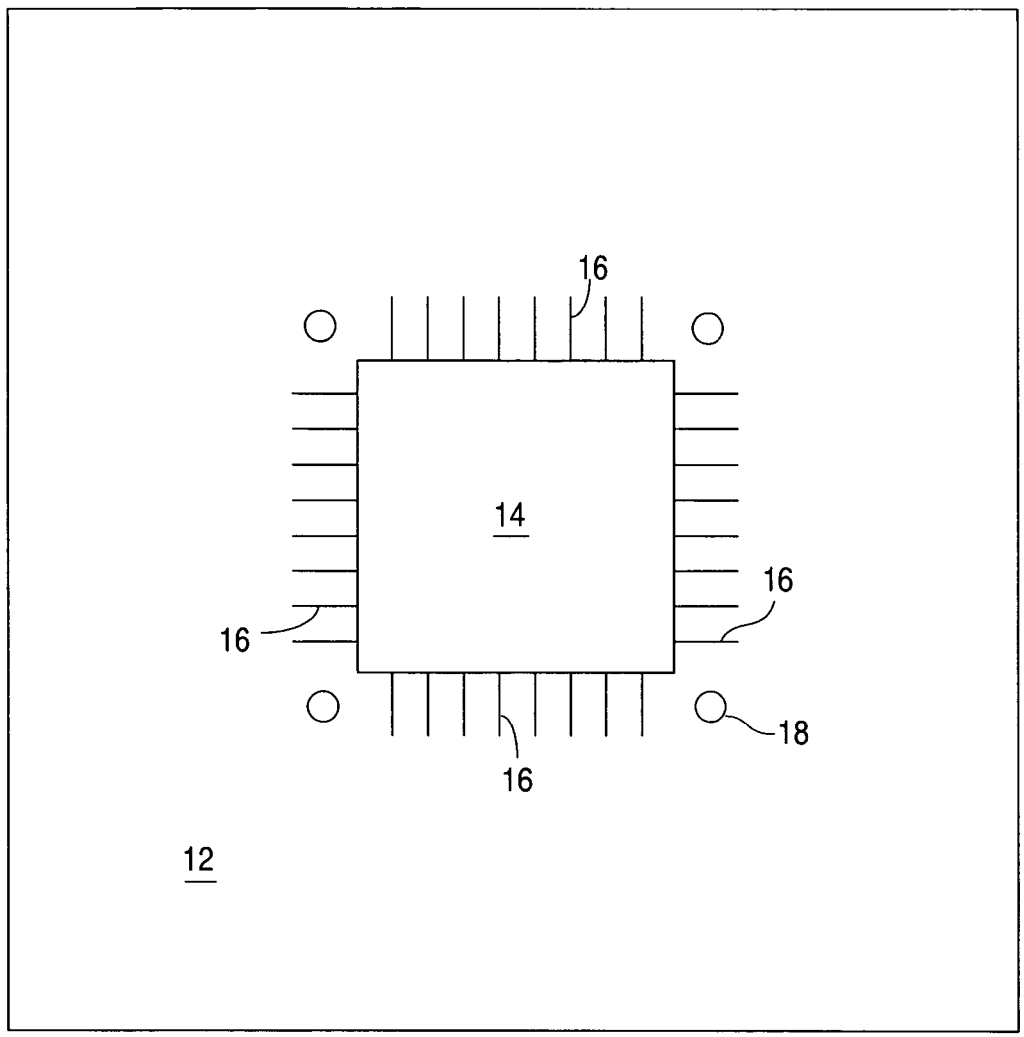
FIG. 1 is a top view of the socket-less test board of the present invention.

Referring to FIG. 1, a top view of the socket-less test board of the present invention is shown. The test board 10 includes a top surface 12 having a recess region 14 and a plurality of contacts 16 positioned adjacent to or surrounding the recess region 14. A plurality of receptacles 18 are provided around the recess region 12. The test board 10 is essentially a multi-layered printed circuit board. The recess region 14 is configured to receive an integrated circuit that is to be electrically tested. The contacts 16 are electrical contacts made of a suitable metal or metal alloy such as copper, aluminum or gold and formed on the surface 12 of the test board using well known printed circuit board metallization techniques. When an integrated circuit is placed into the recess region 14, the leads of the device are in electrical contact with the contacts 16 respectively. The receptacles 18 are used for mounting a clamp, as described in more detail below, used to clamp the integrated circuit to the test board 10.

Figure 2:
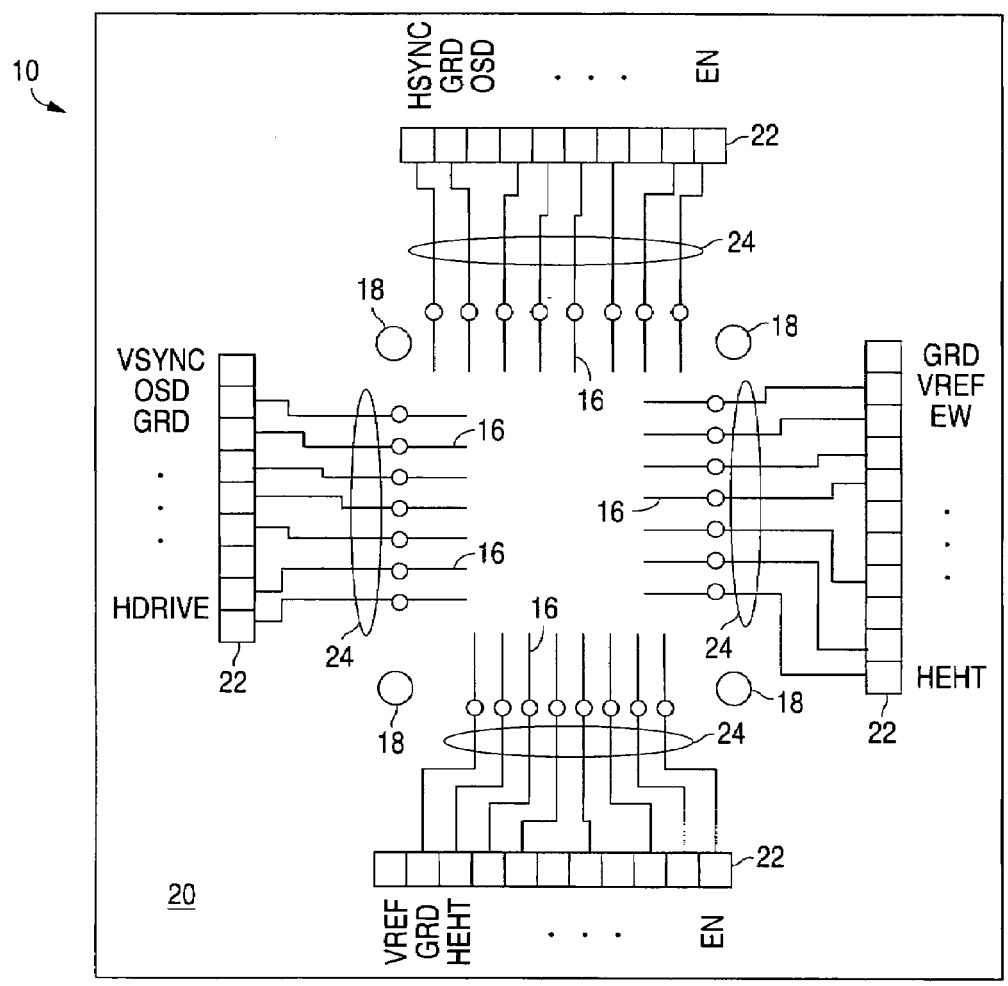
FIG. 2 is a bottom view of the socket-less test board of the present invention.

Referring to FIG. 2, a bottom view of the socket-less test board 10 of the present invention is shown. The bottom surface 20 of the test board 10 includes a plurality of probe points 22 generally arranged around the periphery of the test board 10. A plurality of metal traces 24 are also provided to electrically couple the probe points 22 and the contacts 16. For the sake of illustration, the probe points 22, metal traces 24, and the contacts 16 are all visible as if they are provided on the same layer of the multi-layered test board 10. However, it should be understood, that in most actual implementations, these various metal layers are electrically isolated from one another and may be formed on different layers of the multilayered board and connected using vias as is well known in the art of making printed circuit boards. The probe points 22 are provided for the purpose of being probed by electrical test equipment. In other words, each probe point 22 is configured to either receive and/or output an electrical signal. Received signals are provided to the integrated circuit to be tested in the recess region 14 via the traces 24, contacts 16, to the leads of the integrated circuit in the recess 14. The integrated circuit in response generates outputs signals at its leads which are then transmitted to the probe points 22 via the contacts 16 and traces 24.

In the embodiment shown in the figure, a number of the probe points are labeled with designators such as "GRD" (ground), "VREF" (voltage reference), "EN" (enable), "HSYNC" (horizontal sync), "VSYNC" (vertical synch), etc. It should be noted that these types of signals are only exemplary. Depending on the type of integrated circuit to be tested, other types of signals may be applied. In general, however, the probe signals are designed to determine the electrical specifications of the device under test, as discussed previously herein.

Figure 3:
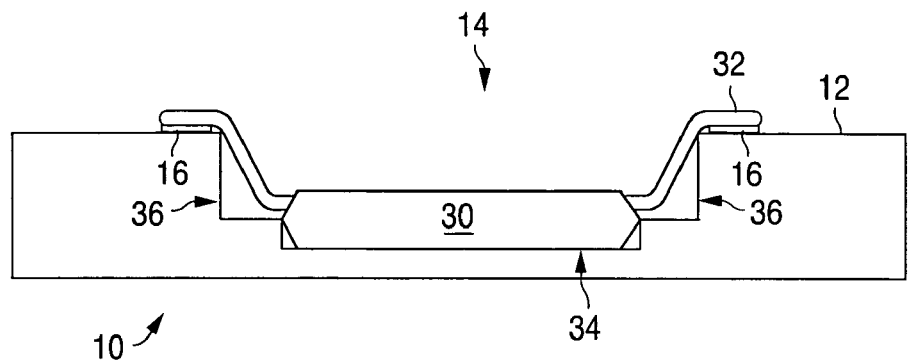
FIG. 3 is a cross section view of the socket-less test board of the present invention.

Referring to FIG. 3, a cross section view of the socket-less test board 10 of the present invention is shown. In this view, a packaged integrated circuit 30 is shown positioned within the recess region 14. The leads 32 of the integrated circuit 30 extend upward and extend out beyond the recess region 14 so as to be in electrical contact with the leads 16 on the top surface 12 of the test board 10. The recess region 14 has a first inner cavity 34 that is configured to receive the package of the integrated circuit 30. In one embodiment, the inner cavity 34 has inner dimensions that are substantially the same as the footprint of the package of the integrated circuit 30 so that the device fits "snugly" within the cavity. The recess 14 also includes a second outer cavity 36 that has a dimension that is sufficiently large so as not to interfere with the leads 30 of the integrated circuit 30.

Figure 4:
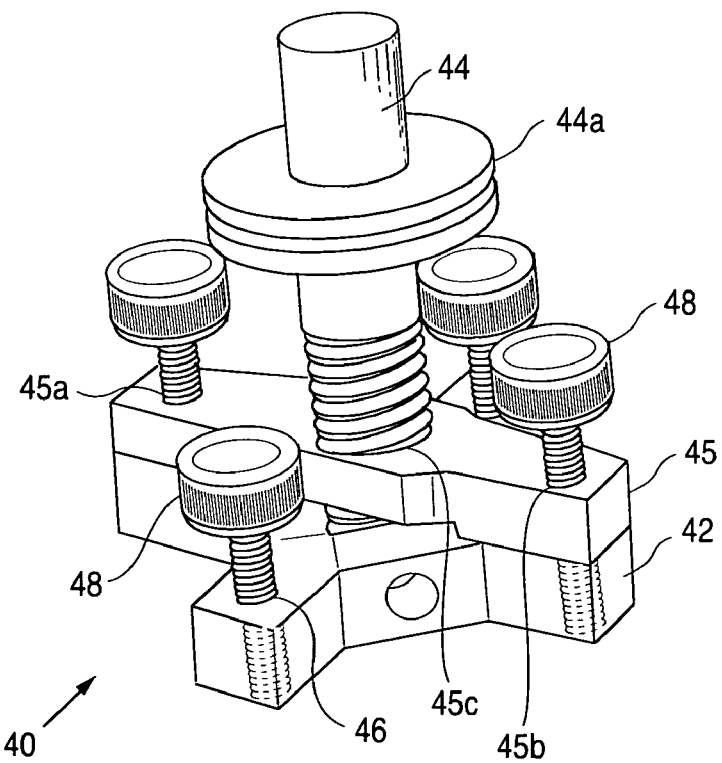
FIG. 4 is a perspective view of the clamp used with the socket-less test board of the present invention.

Referring to FIG. 4, a perspective view of the clamp used with the socket-less test board 10 of the present invention is shown. The clamp 40 includes a base structure 42, heat sink 44 with a heat sink fin 44a, positioning element 45, and mounting elements 46. The positioning element 45 is an elongated metal element having a threaded openings 45a, 45b and 45c. Threaded openings 45a and 45b are located at the far ends of the positioning element 45. The threaded opening 45c is configured to receive and position the heat sink 44 in position over the integrated circuit (not visible). Fastening elements 48 are used to fasten or secure the mounting elements 46 of the base structure 42 to the test board 10. In one embodiment for example, the mounting elements 46 are threaded openings formed in the base structure 42 and the fastening elements 48 are screws. During a mounting operation, the mounting elements 46 of the base structure 42 and the threaded openings 45a and 45b of the positioning element 45 are aligned with the threaded receptacles 18 of the test board 10. The fastening elements 48 are then used to screw and secure the base structure 42 to the test board 10. In addition, the fastening elements 48 also securely hold the positioning element 45 in place. As a result, the heat sink can be rotated up or down to be placed in contact with the integrated circuit 30 in the recess region 14.

Figure 5:
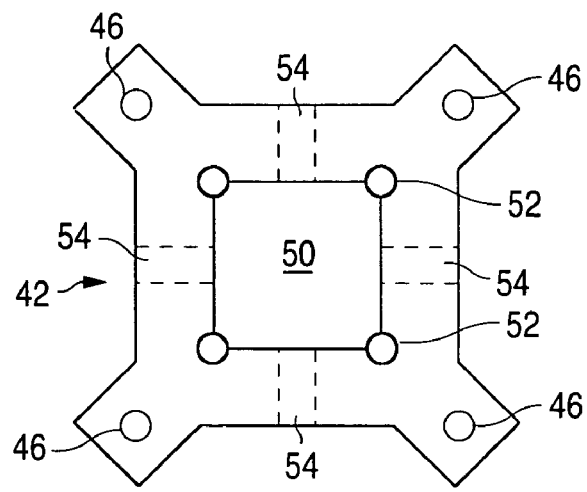
FIG. 5 is a bottom view of a base structure of the clamp used with the socket-less test board of the present invention.

FIG. 5 is a bottom view of the base structure 42 of the clamp 40 is shown. In this view, a recess 50 is provided within the base structure 42. The recess 50 is generally shaped to accommodate the package of the integrated circuit 30. In other words, the recess has four sides, each at a substantially right angle with respect to one another. The integrated circuit 30 is configured to reside within the four walls of the recess region 50. The base structure 42 also includes a first group of vertically aligned purge holes 52. The purge holes are considered to be "vertical" because they are perpendicular to the top surface 12 of the test board when the clamp is mounted onto the board. A second group of horizontal purge holes 54 are provided through the side walls forming the recess 50. Both the first and second group of purge holes 52 and 54 allow a gas or air to be circulated around the integrated circuit 30 during testing.

Figure 6:
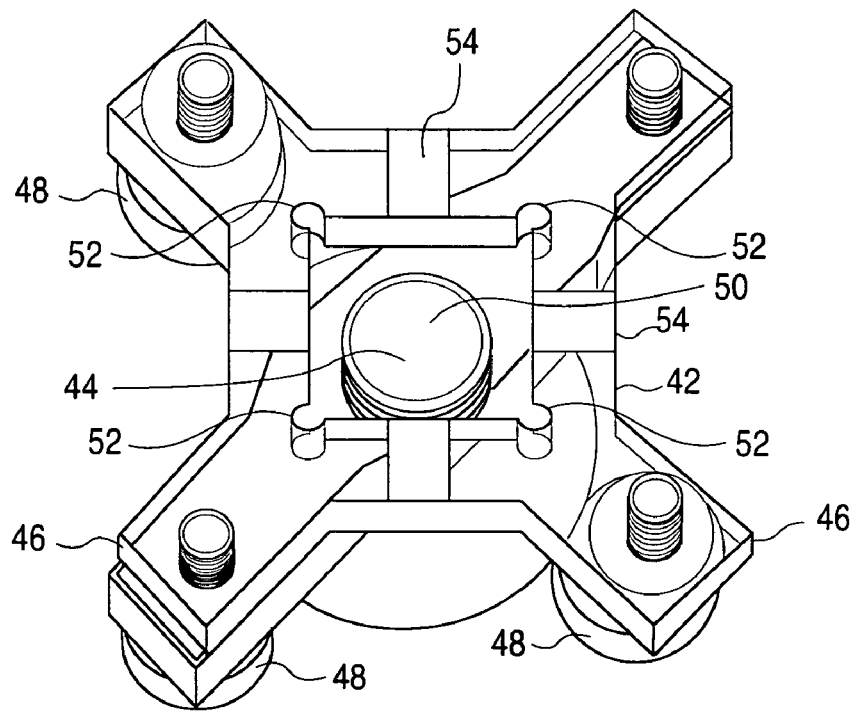
FIG. 6 is a bottom view of the clamp of the present invention.

FIG. 6 is a bottom view of the clamp of the present invention. In this view, the bottom portion of the heat sink 44 is visible through the recess region 50. The first group of purge holes 52 are visible at the four corners defined by the recess region 50. The second group of purge holes 54 arealso visible through the side walls of the base structure 42.

The fastening elements 48 are shown protruding through the mounting elements 46.

Figure 7:
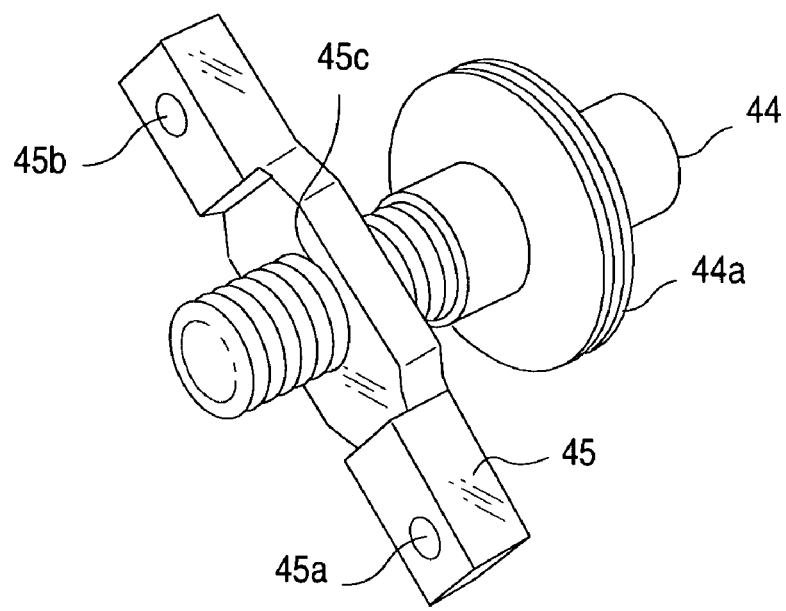
FIG. 7 is a perspective view of the clamp heat sink according to the present invention.

Referring to FIG. 7, a perspective view of just the heat sink 44 and positioning element 45 are shown. In this view, the heat sink 44 is threaded through the opening 45c of the positioning element 45. Also visible are the threaded openings 45a and 45b located at the ends of the positioning element 45.

Figure 8:
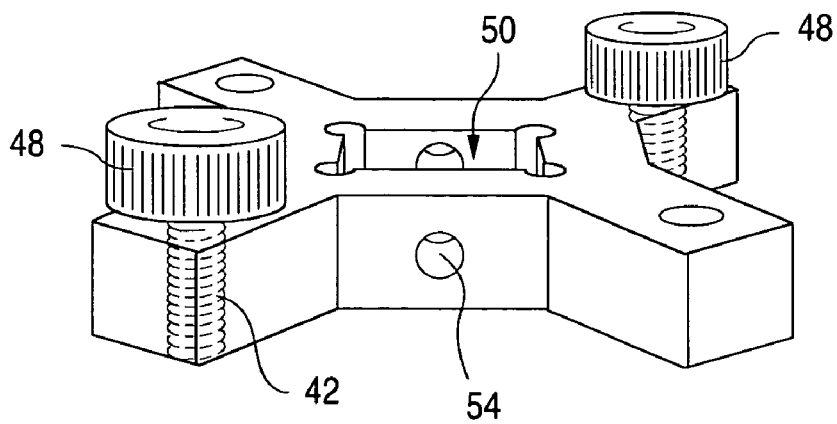
FIG. 8 is a bottom view of the base structure of the clamp according to the present invention.

FIG. 8 is a perspective view of the base structure of the clamp mounted onto the a test board 10 according to the present invention. In this view, the base structure 42 is mounted to the top surface 12 of the test board 10 using two fastening elements 48. An integrated circuit 30 (not shown) is then inserted into the recess region 50. Once the integrated circuit 30 is in place, the heat sink 44 and positioning element 45 are positioned over and secured to the base structure 42 using additional fastening elements 48 as illustrated in FIG. 4 for example.

Figure 9:
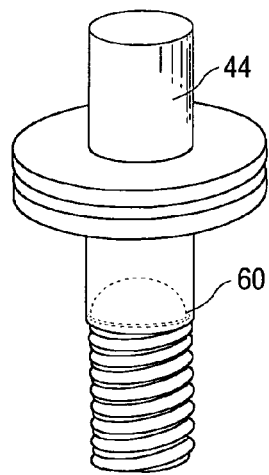
FIG. 9 is a perspective view of another heat sink used with the clamp according to another embodiment of the present invention.

FIG. 9 is a perspective view of another heat sink screw used with the claim according to another embodiment of the invention. In this embodiment, the heat sink 44 includes a pivot joint 60 that allows the threaded portion of the heat sink to rotate. With this embodiment, the bottom of the heat sink can rotate so that its surface can be flush with that of the integrated circuit 30 in the recess region 50 of the clamp.

Figure 10:
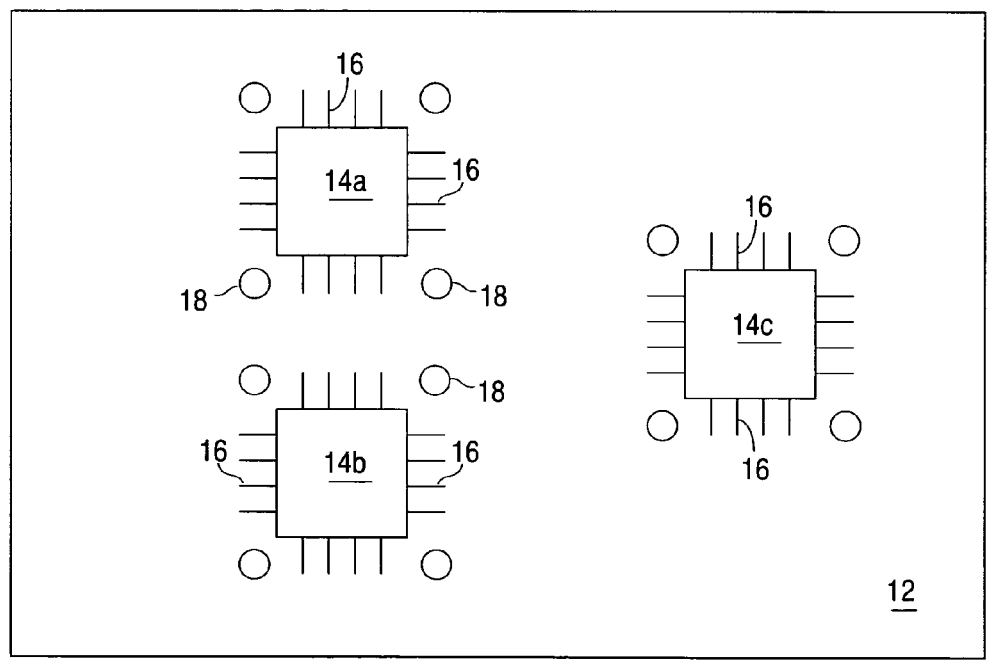
FIG. 10 is a perspective view of another test board according to another embodiment of the present invention.

Referring to FIG. 10, a test board 100 according to an alternative embodiment of the present invention is shown. With this embodiment, the test board 100 includes a plurality of recess regions 14a, 14b and 14c. Each recess region has a plurality of contacts 16 arranged around it's periphery. Receptacles 18 are also provided adjacent each recess region 14a, 14b and 14c respectively. The recess regions 14a, 14b and 14c each have the same general structure including a first inner cavity 34 and a second outer cavity 36 as illustrated in FIG. 3. The test board 100 also includes a number of probe points 22 and traces 24 (not shown). The probe points 22 and traces 24 provide electrical signals to the integrated circuits 30 inserted in the recess regions 14a, 14b and 14c respectively. According to one embodiment, the integrated circuits can all be the same type of chip. In other embodiments, the integrated circuits are different and comprise the a system. The test board 100 thus allows a system of chips to be tested, such as a mother board for a computer.

In various embodiments, the base structure 42 is made of a electrically non-conductive material such as plastic or ceramic. The heat sink 44 is made of a thermally conductive material, such as a metal or metal alloy. Further, the size and material used for the heat sink can vary to alter its heat sinking capabilities as needed. The fastening elements 48 also need not be screws, but could also be pins, bolts, clamps or other fastening devices.

In one embodiment, the elongated positioning member 45 is made of a thermally conductive material, such as aluminum. Together the heat sink 44, fin 44a, and the positioning member 45 are used to dissipate heat generated by the integrated circuit during testing. The amount of heat transfer of the heat sink 44 and positioning element 45 can be controlled by selecting the size and thermal transfer characteristics of the materials used to make the heat sink components.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

We claim:

1. A clamp configured to clamp an integrated circuit directly to a test board, the clamp comprising:
   a recess region formed in a base structure and shaped to accommodate the integrated circuit;
   a heat sink configured to be positioned in contact with the integrated circuit when the integrated circuit is provided in the recess region; and
   one or more mounting elements configured to mount the base structure directly to the test board so that the leads of the integrated circuit are contacted directly to contacts on the test board, the one or more mounting elements being configured to be inserted into one more receptacles in the test board so that the integrated circuit is secured to the test board.

2. The clamp of claim 1, wherein the base structure is made of an electrically non-conductive material.

3. The clamp of claim 2, wherein the base structure is made of one of the following types of electrically non-conductive materials: plastic or ceramic.

4. The clamp of claim 1, wherein the recess region formed in a base structure is configured to accommodate the package of the integrated circuit while not interfering with the position of the leads of the package.

5. The clamp of claim 1, wherein the base structure further comprises purge holes configured to allow air to circulate adjacent the integrated circuit when the integrated circuit is in the recess region.

6. The clamp of claim 5, wherein the purge holes are oriented parallel relatively to the test board when the clamp is mounted to the test board.

7. The clamp of claim 5, wherein the purge holes are oriented perpendicular relative to the test board when the clamp is mounted to the test board.

8. The clamp of claim 1, wherein the recess region has four sides, each side being at a substantial right angle with respect to the other sides.

9. The clamp of claim 8, further comprising purge holes each located at the intersection of the four sides defining the recess region.

10. The clamp of claim 1, wherein the one or more mounting elements are openings formed in the base structure and configured to receive a one or more fastening elements to fasten the base structure to the test board.

11. The clamp of claim 10, wherein the fastening elements are one of the following types of fastening elements: screws, bolts and pins.

12. The clamp of claim 1, wherein the heat sink is made from a thermally conductive material.

13. The clamp of claim 12, wherein the thermally conductive material is one of the following types of materials: metal or metal alloy.

14. The clamp of claim 1, further comprising a positioning element configured to position the heat sink relative to the package of the integrated circuit.

15. The clamp of claim 14, wherein the positioning element further comprises threaded openings used to mount the heat sink to the base structure.

16. The clamp of claim 1, wherein the heat sink further comprises a heat sink fin.

17. A clamp configured to clamp an integrated circuit directly to a test board, the clamp comprising:
   a recess region formed in a base structure and shaped to accommodate the integrated circuit;

a heat sink configured to be positioned in contact with the integrated circuit when the integrated circuit is provided in the recess region;

one or mounting elements configured to mount the base structure directly to the test board so that the leads of the integrated circuit are electrically coupled directly to contacts on the test board, the one or more mounting elements being configured to be inserted into one more receptacles in the test board so that the integrated circuit is secured to the test board; and a positioning element configured to position the heat sink relative to the package of the integrated circuit, wherein the positioning element includes a threaded recess configured to receive the heat sink.

18. The clamp of claim 17, wherein the heat sink is configured to be screwed through the threaded recess of the positioning element so that that heat sink can be rotated into contact with the package of the integrated circuit in the recess region.

19. A clamp configured to clamp an integrated circuit directly to a test board, the clamp comprising:

a recess region formed in a base structure and shaped to accommodate the integrated circuit;

a heat sink configured to be positioned in contact with the integrated circuit when the integrated circuit is provided in the recess region; and one or mounting elements configured to mount the base structure directly to the test board so that the leads of the integrated circuit are electrically coupled directly to contacts on the test board, the one or more mounting elements being configured to be inserted into one more receptacles in the test board so that the integrated circuit is secured to the test board, wherein the heat sink has an elongated member and a threaded member mechanically coupled together with a rotating joint, the rotating joint enabling the threaded member to be positioned flush with the surface of the integrated circuit when the integrated circuit is recessed in the recess region and the heat sink is positioned in contact with the integrated circuit.

* * * * *